(12) United States Patent
Van Gompel (10) Patent No.: US 9,103,532 B2
(45) Date of Patent: Aug. 11, 2015

(54) LED-BASED MODULAR ASSEMBLY

(75) Inventor: Waltherus Emericus Johannes Van Gompel, Eersel (NL)

(73) Assignee: Koninklijke Philips N.V., Eindhoven (NL)

( * ) Notice: Subject to any disclaimer, the term of this patent is extended or adjusted under 35 U.S.C. 154(b) by 54 days.

(21) Appl. No.: 13/980,614

(22) PCT Filed: Jan. 18, 2012

(86) PCT No.: PCT/IB2012/050233
§ 371 (c)(1),
(2), (4) Date: Jul. 19, 2013

(87) PCT Pub. No.: WO2012/101547
PCT Pub. Date: Aug. 2, 2012

(65) Prior Publication Data
US 2013/0301264 A1    Nov. 14, 2013

(30) Foreign Application Priority Data

Jan. 25, 2011    (EP) ..................................... 11305075

(51) Int. Cl.
*F21V 19/00*     (2006.01)
*F21S 2/00*      (2006.01)
*F21V 5/00*      (2015.01)
*G02B 3/00*      (2006.01)
*F21Y 101/02*    (2006.01)
*H01L 33/48*     (2010.01)

(52) U.S. Cl.
CPC ............... *F21V 19/003* (2013.01); *F21S 2/005* (2013.01); *F21V 5/007* (2013.01); *G02B 3/0056* (2013.01); *F21Y 2101/02* (2013.01); *H01L 33/486* (2013.01); *H01L 2924/0002* (2013.01)

(58) Field of Classification Search
CPC ............. F21V 19/00; F21V 5/00; F21V 5/08; F21V 17/00; F21V 17/002; F21V 19/003; F21V 5/007; H01L 2924/0002; F21S 2/005; F21Y 2101/02
See application file for complete search history.

(56) References Cited

U.S. PATENT DOCUMENTS

| 7,187,501 | B2  |   | 3/2007 | Wakisaka |
|-----------|-----|---|--------|----------|
| 7,489,456 | B2  |   | 2/2009 | Yang et al. |
| 8,348,461 | B2  | * | 1/2013 | Wilcox et al. ............ 362/249.02 |
| 2005/0083691 | A1 |  | 4/2005 | Jahn et al. |
| 2008/0170396 | A1 |  | 7/2008 | Keller et al. |
| 2010/0033956 | A1 |  | 2/2010 | Kirchberger et al. |

FOREIGN PATENT DOCUMENTS

| EP | 2056014 A2 | 5/2009 |
|----|-----------|--------|
| WO | 0058762 A2 | 10/2000 |

* cited by examiner

*Primary Examiner* — Bao Q Truong
(74) *Attorney, Agent, or Firm* — Meenakshy Chakravorty (57) ABSTRACT

The invention refers to a Lighting system comprising: a LED board bearing LEDs; and an optical board on the LED board; wherein the optical board is made of optical modules positioned side-by-side according to predetermined orientations one to the other, each optical module comprising at least one optical element adapted to face at least one of said LEDs and modify feature of the light emitted by this at least one LED, wherein the lighting system is provided with mechanical fool proofing elements adapted to prevent a positioning of the optical modules according to orientations one to the other different from said predetermined orientations.

14 Claims, 9 Drawing Sheets

LED-BASED MODULAR ASSEMBLY

FIELD OF THE INVENTION

The invention relates to LED-based lighting systems (e.g. luminaires or parts thereof) comprising a LED board (e.g. printed circuit board) bearing LEDs and an optical board on the LED board. The optical board is made of optical modules positioned side-by-side, each optical module comprising at least one optical element adapted to face at least one of said LEDs and to modify feature of the light emitted by this at least one LED.

BACKGROUND OF THE INVENTION

Some of these optical elements might be arranged to modify the wavelengths of the emitted light (e.g. phosphor materials embedded in an transparent optical film or board) and/or some other optical elements (e.g. lenses, prisms, etc.) might be designed to modify the direction and/or shape of the emitted light rays—for example, to output a specific asymmetrical light distribution—and/or some other optical elements (e.g. lenses, prisms, etc.) might be designed to mix light emitted by different LEDs—especially if optical elements facing several LEDs of different colors.

Today, many of such LED-driven light systems are available on the market, giving multiple possibilities for the designer to reach desired multiple light effects.

Due to these high number of possible configurations, the modular approach, using the aforementioned optical modules (having each specific optical properties for a limited number of LEDs), allows to build various lighting systems, by assembling these optical modules together, side-by-side, giving more flexibility in the design conception than the previous approaches (made of single integral optical boards). This modular architecture is especially useful for lighting systems having: a high number of LEDs and/or different kinds of output light patterns.

Moreover this modular architecture can be performed from a limited number of types of modules, if similar optical modules are used in a single lighting system. Therefore one can imagine designing different lighting systems from optical boards having similar configurations and/or sizes. In particular, it would be advantageous to standardize these types of optical boards to be used in lighting systems, so as to reduce further the number of types of optical boards. These optical boards may therefore be industrially manufactured in massive quantities, decreasing the price per piece. Moreover the management of the stock would be easier since less references would have to be stored.

Nevertheless, these optical modules have to assembled side-by-side, and this assembly has to be sufficiently reliable to be industrially implementable.

SUMMARY OF THE INVENTION

The present invention provides a LED-based lighting system, including a modular optical assembly, intending to address the aforementioned drawback.

The invention intends more specifically to solve the problems, in an industrial process, of misalignments and/or errors of orientations of the optical modules when the optical modules are assembled side-by-side.

A purpose of the invention is therefore to decrease the risks of false assembly of the system, in an industrial environment.

Another purpose of the invention is to provide a light architecture which can reduce the manufacturing costs of the lighting system while maintaining its energy and light performances.

Another purpose of the invention is to make a cheaper and easier luminaire assembly.

Another purpose of the invention is to facilitate the recycling of the lighting system or part thereof.

In order to solve said problems and meet said purposes, the invention proposes, as a first embodiment, a lighting system according to claim 1.

By preventing a wrong positioning of the optical modules, these mechanical fool-proofing elements avoid the aforementioned issues during assembly of the optical modules: misalignment and/or assembly according to wrong orientations of the optical modules.

The "true" orientations of the optical modules correspond to said "predetermined orientations" as recited in claim 1, and are determined to reach predetermined lighting effects.

A first type of optical configuration for which these predetermined orientations might have some importance, is a configuration having optical modules or optical elements different one to the others.

As a first example, optical elements may have specific optical features in a first zone of the lighting system and other optical elements may have other specific optical features in another zone of the lighting system, such that the lighting system exhibit different optical features over its optical board. For instance, in case the lighting system is an outdoor road luminaire, it might be interesting to design a "mixture" of dedicated lenses exhibiting an optical distribution in front of or near the pole, and other lenses exhibiting another optical distribution further away from the pole. The regularity caused by fool-proofing elements takes care of a total light distribution of such system correctly positioned in the optical board.

As a second example, color mixing could also be an interesting possibility, in case the optical elements face different colors, and the colors outputting from different optical elements are then mixed downstream the optical board at the surface to illuminate and upstream: light rays outputting from optical elements should therefore be directed so as to perform this mixing, and therefore the light distributions of the optical elements have to be designed to fulfill this color mixing, and the optical elements have to be correctly oriented—especially in case of asymmetrical distributions. The fool-proofing concept of the invention clearly avoids some errors in these orientations during the assembly process. It is to be noticed that, by switching ON and OFF or dimming UP or DOWN certain LEDs, the colors can be changed.

A second type of optical configuration for which said predetermined orientations might have some importance, is a configuration in which optical elements have asymmetrical optical features.

As a first example, the optical elements might be lenses or prisms exhibiting asymmetrical optical distribution. Accordingly, the illumination by the lighting system can change significantly depending on the orientations of the optical modules. True orientations of these modules are therefore very important, and the fool-proofing elements reduce the risk of wrong orientations during industrial assembly.

As a second example, the optical elements might have asymmetrical forms (e.g. logos, or asymmetrical phosphor pattern) whose orientations on the surface to be illuminated might have some importance regarding the desired light effect. And, again, the fool-proofing elements reduce the risk of wrong orientations during industrial assembly.

A third type of optical configuration for which said predetermined orientations might have some importance, is a configuration in which the optical design is made of several types of optical elements spread over different optical modules (e.g. the lighting system may be provided with optical elements having phosphor materials, other designed to mix colors, other to deviate emitted light rays to specific directions, etc. or a combination thereof): in this case also, it is important to prevent any wrong positioning and wrong orientations of the optical modules.

The person skilled in the art can see clearly the advantage of using the fool-proofing elements of the invention, in other types of optical configurations, as long as the orientations of the optical modules in these optical configurations have an impact upon the output light features of the lighting system.

Optionally, said lighting system is according to one embodiment.

By locating the fool-proofing elements at the optical modules, the poka-yoke relate only to the optical assembly, independently from the LED board used with. Therefore the optical positioning is entirely free and flexible regardless of the LED board used with, provided that location of the optical elements correspond to the location of the LEDs. Moreover, each optical module can be replaced easily, without modifying the beneath configuration of the lighting system.

Optionally, said lighting system is according to another embodiment.

As aforementioned, the fool-proofing elements of the invention can be useful, especially during an industrial assembly, to avoid wrong orientations and therefore to avoid a wrong illumination, especially in a lighting system where all or several optical modules have to exhibit the same asymmetrical optical distribution: once a fixed position is chosen for the first optical module, the positioning of the following optical modules are determined thanks to the fool-proofing (or Poka-Yoke) design of the optical modules; then all the individual light distributions of the optical modules are oriented in the same direction.

Optionally, said lighting system is according to another embodiment.

According to this option of the invention, one LED module is fixed with each optical module. LED modules can be fixed to the optical modules before the LED modules are positioned side-by-side: this process of assembly allows to assembly both the optical board and the LED board in a single manufacturing step. Alternatively, the LED modules can be fixed to the optical module after the LED modules are assembled together.

This option allows to manufacture also the LED board per modules, which might be useful and advantageous for the manufacturing (in particular the storage and transportations of the LED boards are less cumbersome, and smaller manufactories can be used) and for the re-leding (only one LED module can be replaced instead of the whole LED board).

Optionally, said lighting system is according to another embodiment.

In this case, the fool-proofing elements are all the more useful than the optical modules look identical, the problem of false-positioning or false-orientations being therefore more likely.

Moreover: by providing the optical board with similar optical modules, the number of types of optical modules in optical boards are significantly reduced, and these optical boards may therefore be industrially manufactured in greater quantities, decreasing the price per piece. Moreover the management of the stock would be easier since less references have to be stored. One can imagine standardizing these optical modules so as to reduce again the number of types of optical modules, leading to a further reduction of the costs of the optical modules.

Optionally, said lighting system is according to another embodiment.

The chassis allows to rigidify the whole system. Optionally, this chassis is provided with an integrated heat management device or system (e.g. passive and/or active cooling system).

According to a second embodiment, the invention proposes a lighting module according to one embodiment.

Optionally, the lighting module is according to another embodiment.

The mechanical fool-proofing elements participate accordingly directly to the assembly side-by-side of the optical modules, by preventing the side-by-side positioning in case of a positioning not in accordance with the desired configuration. A wrong positioning of the optical modules is therefore not allowed.

Optionally, the lighting module is according to another embodiment.

In case the optical module has to be positioned side-by-side with another optical module having the same fool-proofing elements, the side of the optical module having the first mechanical fool-proofing elements can be positioned only with the side of the other optical module having the second mechanical fool-proofing elements; and the side of the optical module having the second mechanical fool-proofing elements can be positioned only with the side of the other optical module having the first mechanical fool-proofing elements.

As an example, this option might be useful for optical modules having triangular shapes with identical fool-proofing elements on two of their sides, e.g. to be assembled side-by-side around one of a common apex These fool-proofing elements for triangular-shaped optical module can be especially useful for isosceles triangle (the two equal sides being the sides provided with the fool-proofing elements) or for equilateral triangle. Alternatively, this option might be useful for a lighting system having an optical board made of a line of optical modules, e.g. of rectangular shape, having fool-proofing elements located at two opposite sides of the optical modules. These fool-proofing elements may be asymmetrical, meaning that the centre point of these fool-proofing elements (i.e. the center point between the fool-proofing elements) is offset from the centre point of the side at which the fool-proofing elements are provided.

Optionally, the lighting module is according to another embodiment.

This option might be useful in the particular case of having an optical board comprising triangular optical modules.

Optionally, the lighting module is according to another embodiment.

In case the optical module has to be positioned side-by-side with another optical module having the same fool-proofing elements:
  the side of the optical module having the first mechanical fool-proofing elements can be positioned only with the side of the other optical module having the second mechanical fool-proofing elements;
  the side of the optical module having the second mechanical fool-proofing elements can be positioned only with the side of the other optical module having the first mechanical fool-proofing elements;
  the side of the optical module having the third mechanical fool-proofing elements can be positioned only with the side of the other optical module having the fourth mechanical fool-proofing elements; and the side of the optical module having the fourth mechanical fool-proofing elements can be positioned only with the side of the other optical module having the third mechanical fool-proofing elements.

Optionally, the lighting module is according to another embodiment.

The protruding element prevents from an assembly side-by-side with another optical module, except if this other optical module comprises a slot into its side able to receive the protruding element within, operating therefore a fool-proofing function.

Optionally, the lighting module is according to another embodiment.

This configuration allows to rotate the optical module by one or several angles (e.g. 30°, 45°, 90° if the optical module comprises, respectively, twelve, eight, four optical elements) around said center point of the optical module, and, for each positioning after rotation, still having one optical element facing one (or a cluster of) LED(s). This configuration gives more possibility to the designer several positioning are possible from the same optical module and the same LEDs.

Optionally, the lighting module is according to another embodinent.

This configuration allows to rotate the optical module by one or several angles (e.g. 30°, 45°, 90° if the optical module comprises, respectively, twelve, eight, four optical elements) around said center point of the optical module, and, for each positioning after rotation, still having one optical element facing one (or a cluster of) LED(s). This configuration gives more possibility to the designer—several positioning are possible from the same optical module and the same LEDs.

Additionally, due to the symmetric aspect of the optical module, the wrong-positioning or wrong orientation of the optical module in the optical board is more likely, and the fool-proofing elements are accordingly very useful.

Optionally, the lighting module is according to another embodiment.

These marks on the optical modules facilitate clearly the industrial positioning, and the true orientations, of the optical modules. This marking might be drawn, painted or molded on the base part of the optical module, so as to be sufficiently visible by a person assembling the lighting system or by a device arranged in the manufacturing process to detect and identify these markings.

BRIEF DESCRIPTION OF THE DRAWINGS

Other features and advantages of the invention appear from the following detailed description of one of its embodiments, given by way of non-limiting example, and with reference to the following drawings.

DETAILED DESCRIPTION OF THE INVENTION

Figure 6:
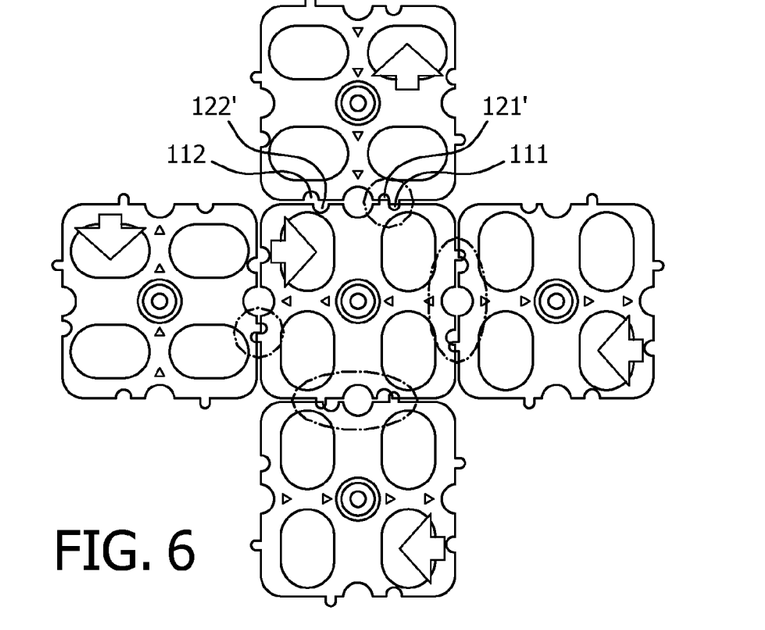
FIG. 6 shows a top view of a wrong assembling of optical modules of FIG. 1.

FIG. 6 shows an example of a lighting system according to the invention, comprising:
- a LED board 700 bearing at least LEDs 750, 760, 770, 780; and
- an optical board on the LED board 700, made at least partly of optical modules 100, 100', 100" positioned side-by-side.

The LED board 700 may be provided with or without circuitry, such a circuitry being arranged to supply and/or drive the LEDs 750, 760, 770, 780 and the other LEDs not shown in FIG. 6 (they are indeed covered by optical modules 100', 100"). In case the LED board 700 is provided with circuitry, at least one electrical connector 799 can be provided to supply with electrical power the LED board 700 and/or to communicate with other LED boards and/or control unit(s) (not shown). Moreover, the LED board 700 may be provided with through holes 710 for fixing, via a fixation means (e.g. a screw or rivet 900), through it to a chassis 1 of the lighting system.

The optical board is made at least partly of optical modules 100, 100', 100" positioned side-by-side. Each optical module 100 comprises four lenses 150, 160, 170, 180 adapted to face or cover respectively said LEDs 750, 760, 770, 780. Lenses 150, 160, 170, 180 are designed to modify the distribution of the light emitted by these LEDs 750, 760, 770, 780. In this example, lenses 150, 160, 170, 180 are designed to output an asymmetrical light distribution (see as an example reference 1000 in FIG. 5 giving an example of asymmetrical light distribution).

Figure 1:
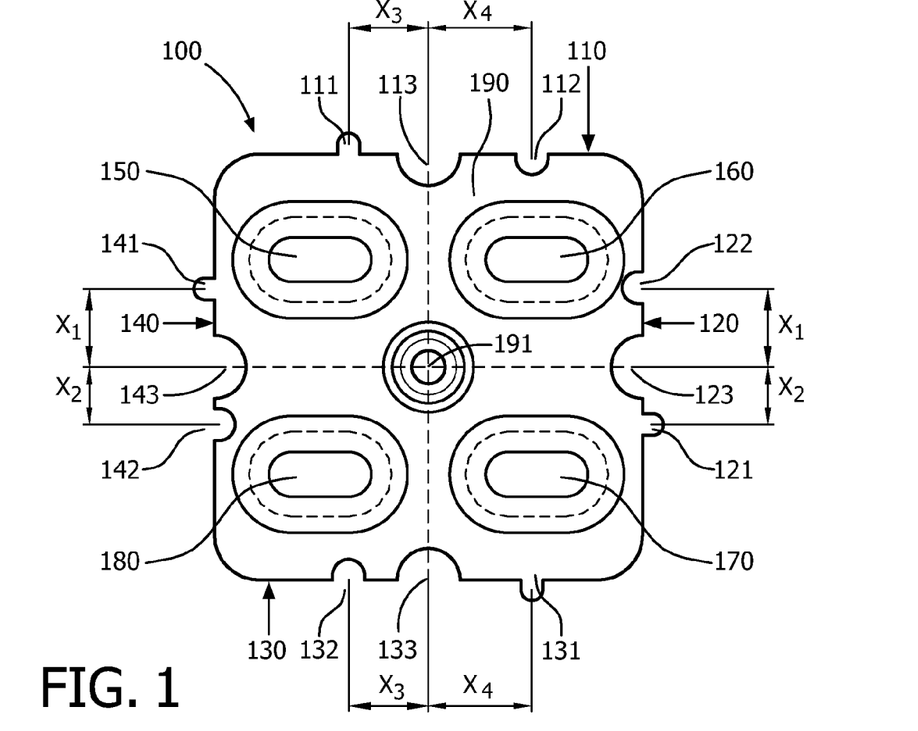
FIG. 1 shows a top view of a module according to the invention.
Figure 2:
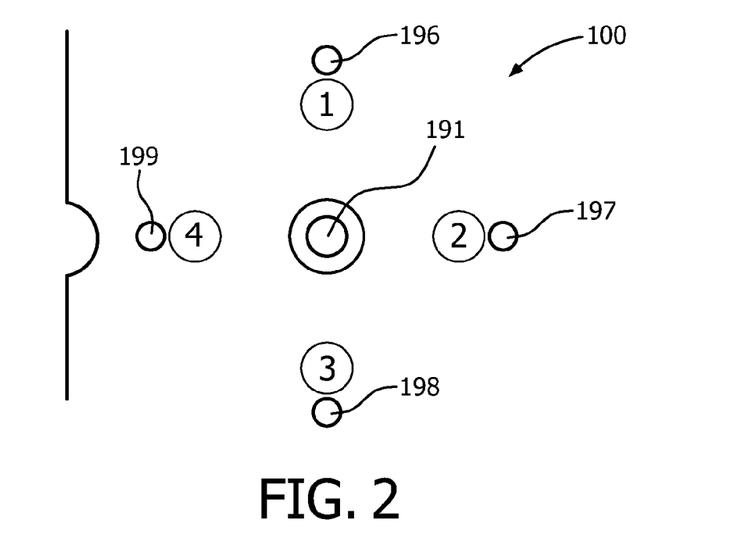
FIG. 2 shows a bottom view of the module of FIG. 1.

Turning now to a particular optical module 100, as depicted in FIGS. 1 and 2, the optical module 100 might be made in a transparent material (e.g. PMMA, PC, Silicon, Transparent Casting Plastics, PET). This optical module 100 might be molded or cast. The optical module 100 has a base extending mainly over a plane, having a top face (shown in FIG. 1), a bottom face (shown in FIG. 2) and sides 110, 120, 130, 140 extending between the top and bottom faces. The base bears the lenses 150, 160, 170, 180.

The bottom face is to contact the LED board 700. In order to help the positioning of the optical module 100 on the LED board 700, some positioning elements 196, 197, 198, 199 (e.g. small protrusions or pins) may be provided on this bottom face, and complementary positioning elements 796, 797, 798, 799 (e.g. small cavities or through holes) may be provided on the top face of the LED board 700 (see FIG. 6).

In order to fix the optical module 100 to the LED board 700 and/or to the chassis 1, via a fixation means 900, a through hole 191 is provided, e.g. at the center of the optical module 100. Alternatively, through holes 113, 123, 133, 143 may be provided at each side 110, 120, 130, 140 of the optical module 100 so as to allow the attachment of the optical module 100 to the LED board 700 and/or to the chassis 1, via a fixation means 900, by the sides of the optical module 100. Alternatively, both holes 191 and holes 110, 120, 130, 140 can be provided through the optical module 100: one (through hole 191) can be used to fix the optical module 100 to the LED board 700 and others (through holes 113, 123, 133, 143) can be used as paths for fixation means (e.g. screws or rivets) to fix the LED board 700 onto the chassis 1.

In this particular example, the optical module 100 has a square shape, with a first side 110 opposite the second side 130, and a third side 120 opposite the fourth side 140. Lenses 150, 160, 170, 180 may be located at an equal distance from the through hole 191 (i.e. center of the square) of the optical module 100, and might have identical asymmetrical light distributions such that the output light rays are oriented towards side 110 in FIG. 1. With this squared configuration, the optical module 100 can be freely placed over any cluster of four LEDs 750, 760, 770, 780 of the particular LED board 700 of FIG. 6. Additionally, the optical module 100 can be oriented into four positions over the same cluster of LEDs 750, 760, 740, 760, by rotating it three times by 90°, from an initial positioning, around the through hole 191. Given said specific configurations of the lenses 150, 160, 170, 180, said rotations of the optical module 100 lead also to the rotation by three times 90° of the asymmetrical light distribution 1000 output from the lenses 150, 160, 170, 180. Therefore the surface illuminated from the optical module 100 can be changed simply by rotating the optical module 100 around the through hole 191. Fixation means 900 might be used to facilitate such adjustment of the illumination.

Furthermore the optical module 100 is provided with fool-proofing elements 111-112, 131-132, 121-122, 141-142 at, respectively, the first, second, third and fourth sides 110, 130, 120, 140. In this example, the fool-proofing elements of each side are made of protruding elements 111, 121, 131, 141 extending from the respective sides 110, 120, 130, 140 and holes or cavities or slots 112, 122, 132, 142 provided into the respective sides 110, 120, 130, 140. Fool-proofing elements can be of any shape (e.g. rectangular, round, triangular, etc.).

Preferably, the fool-proofing elements 111 and 112/121 and 122/131 and 132/141 and 142, are asymmetrical with respect to the centre point of the respective sides 110/120/130/140, i.e. the distances, as depicted in FIG. 1, x1 and x2 are different one from the other and the distances x3 and x4 are different one from the other.

The first fool-proofing elements 111, 112, provided at the first side 110, are adapted to cooperate with the second fool-proofing elements 131, 132 provided at the second side 130 (if these two sides 110 and 130 would be face to face), and second fool-proofing elements 121, 122, provided at the third side 120 are adapted to cooperate with the fourth fool-proofing elements 141, 142, provided at the fourth side 140 (if these two sides 120 and 140 would be face to face). In other words:

the distances x3 separating respectively the fool proofing elements 111 and 132 and the centre points of the sides 110 and 130 are the same;

the distances x4 separating respectively the fool proofing elements 112 and 131 and the centre points of the sides 110 and 130 are the same;

the distances x2 separating respectively the fool proofing elements 121 and 142 and the centre points of the sides 120 and 140 are the same;

the distances x1 separating respectively the fool proofing elements 122 and 141 and the centre points of the sides 120 and 140 are the same;

Additionally, the positions of the first and second fool-proofing elements 111, 112, 131, 132 with respect to, respectively, the first and second sides 110, 130 are different in comparison with the positions of the third and fourth fool-proofing elements 121, 122, 141, 142 with respect to, respectively, the third and fourth sides 120, 140. In other words the distances x1 and x2 are different from the distances x3 and x4. As a consequence, the first and second fool-proofing elements 111, 112, 131, 132 cannot cooperate with either of the third and fourth fool-proofing elements 121, 122, 141, 142 (if either of the first and second sides 110, 130 would be face to face with either of the third and fourth sides 120, 140).

Figure 3:
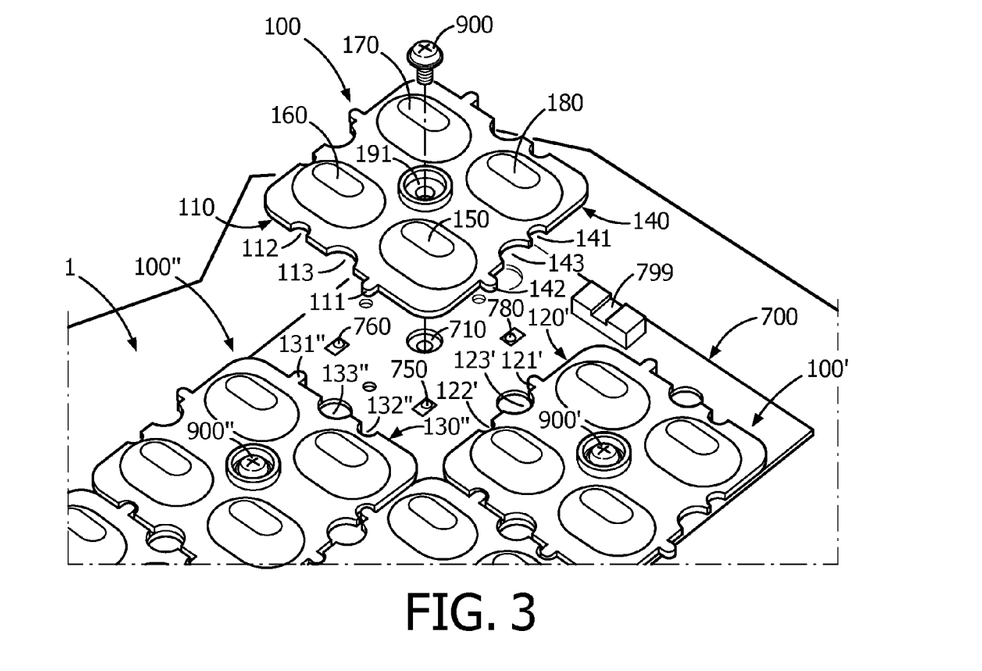
FIG. 3 shows a top perspective view of a part of a lighting system of the invention, comprising several modules of FIG. 1, with an illustration of assembly of an optical module to a LED board.
Figure 4:
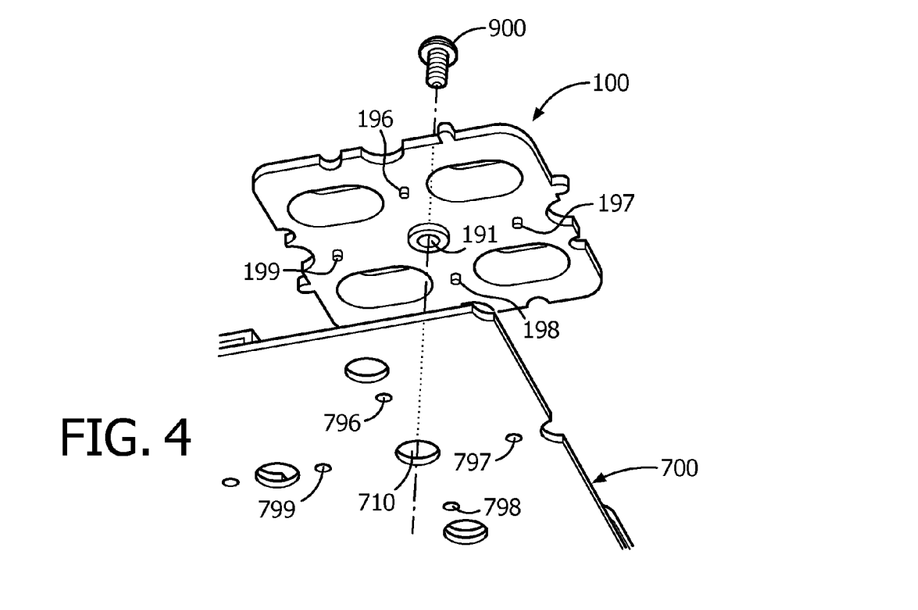
FIG. 4 shows a bottom perspective view of a portion of the lighting system of FIG. 3.
Figure 5:
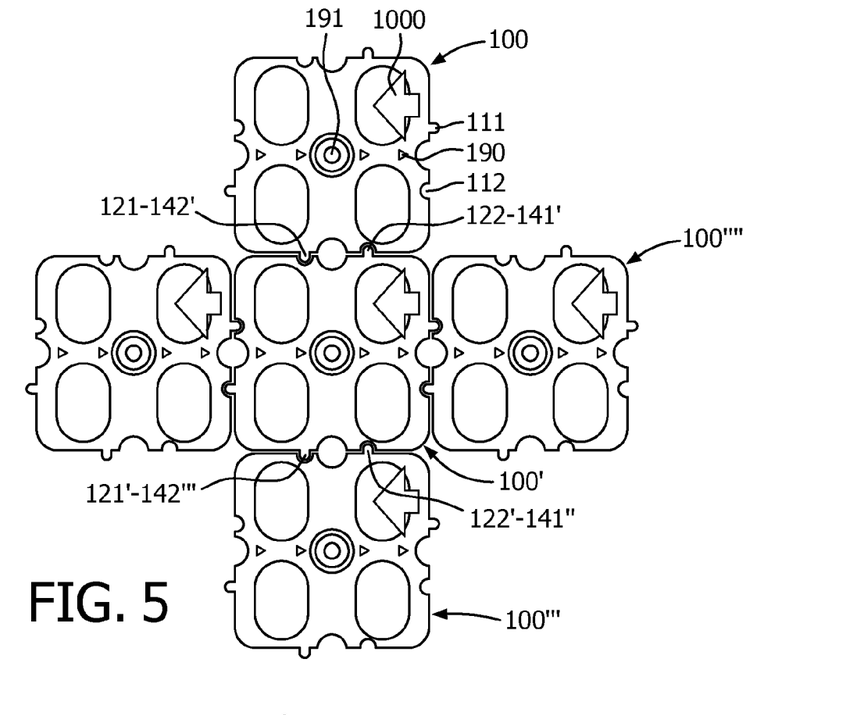
FIG. 5 shows a top view of a true assembling of optical modules of FIG. 1.

Consequently, the fool-proofing (or poka-yoke) function is fulfilled if the optical board is made of a plurality of optical modules having sides provided with these similar fool-proofing elements, as shown in FIG. 3, but also in FIGS. 5 and 6 depicting respectively a true orientation and a false orientation of the optical modules 100, 100', 100" and 100'''—optical modules 100' having respectively third and fourth fool-proofing elements 121', 122' and 141', 142' and optical module 100" having fourth fool-proofing elements 141" and 142".

Therefore, in case the optical module 100 has to be positioned side-by-side with another optical module 100' having the same fool-proofing elements:

the side 110 of the optical module 100 having the first mechanical fool-proofing elements 111, 112 can be positioned only with the side 130' of the other optical module 100' having the second mechanical fool-proofing elements 131', 132';

the side 130 of the optical module 100 having the second mechanical fool-proofing elements 131, 132 can be positioned only with the side 110' of the other optical module 100' having the first mechanical fool-proofing elements 111', 112';

the side 120 of the optical module 100 having the third mechanical fool-proofing elements 121, 122 can be positioned only with the side 140' of the other optical module 100' having the fourth mechanical fool-proofing elements 141', 142'; and the side 140 of the optical module 100 having the fourth mechanical fool-proofing elements 141, 142 can be positioned only with the side 120' of the other optical module 100' having the third mechanical fool-proofing elements 121', 122'.

Therefore, the positioning or orientation of the first optical module 100 on the LED board 700 predetermines the positioning of the other optical modules to be positioned side-by-side on the LED board 700. The mechanical fool proofing elements of the invention are therefore adapted to prevent a positioning of the optical modules according to orientations one to the other different from some predetermined orientations.

In the exemplary case as depicted by FIGS. 1-7, all the optical modules 100', 100', 100", 100", etc. may have identical lenses 150, 160, 170, 180 exhibiting the same optical asymmetry 1000—i.e. the light rays are oriented into parallel directions non perpendicular or oblique to the optical board: these types of optical designs might be useful for instance in road lighting applications in which the outdoor luminaire (embedding the lighting system of the invention) is located on the sides of the road and in which the light needs to be directed to the road: said specific directions can then be chosen to illuminate the road and not the side way. In that case, the orientation of the first optical module to be mounted onto the LED board gives the optical orientation of the whole luminaire, and the fool-proofing elements are useful to prevent from a wrong positioning of the other optical modules. To help also the assembly process of these optical modules, the optical modules can comprise some markings, such as for instance arrows 190, giving the directions of said specific orientations. These markings can be integrated in the mould used to make the optical modules, or made afterwards with a specific whittled tools, or some paintings or other kinds of method or tools to make such markings.

Figure 7:
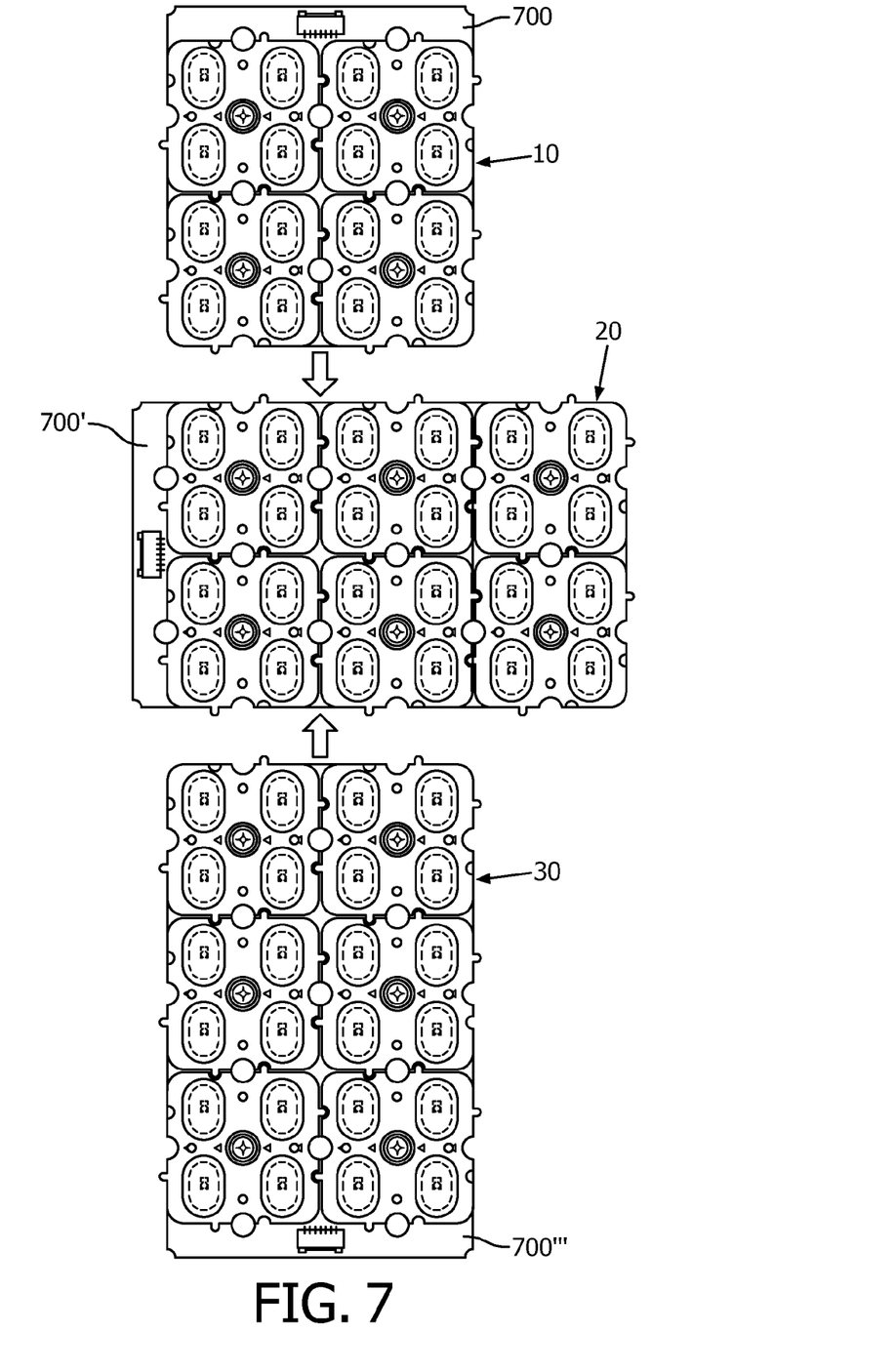
FIG. 7 shows a top view of an assembly of several LED boards and LED modules of optical modules of FIG. 1, in a lighting system.

FIG. 7 shows an example of a lighting system made of three lighting modules 10, 20, 30, each comprising a LED module (respectively 700, 700', 700"), each bearing a plurality of optical modules. Alternatively, each lighting module can comprise a plurality of LED modules, one LED module being located beneath one optical module (not shown in FIG. 7), and being assembled with the optical modules before the LED modules are mounted onto the chassis 1.

Figure 8:
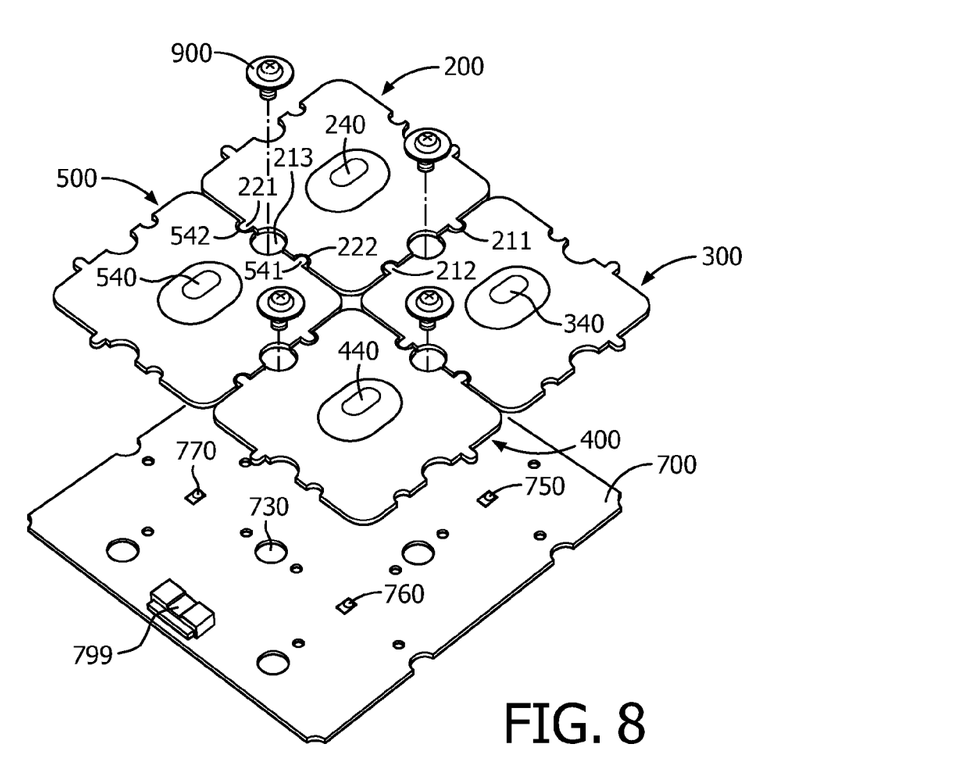
FIG. 8 shows a top perspective exploded view of another lighting system of the invention, before assembly.
Figure 9:
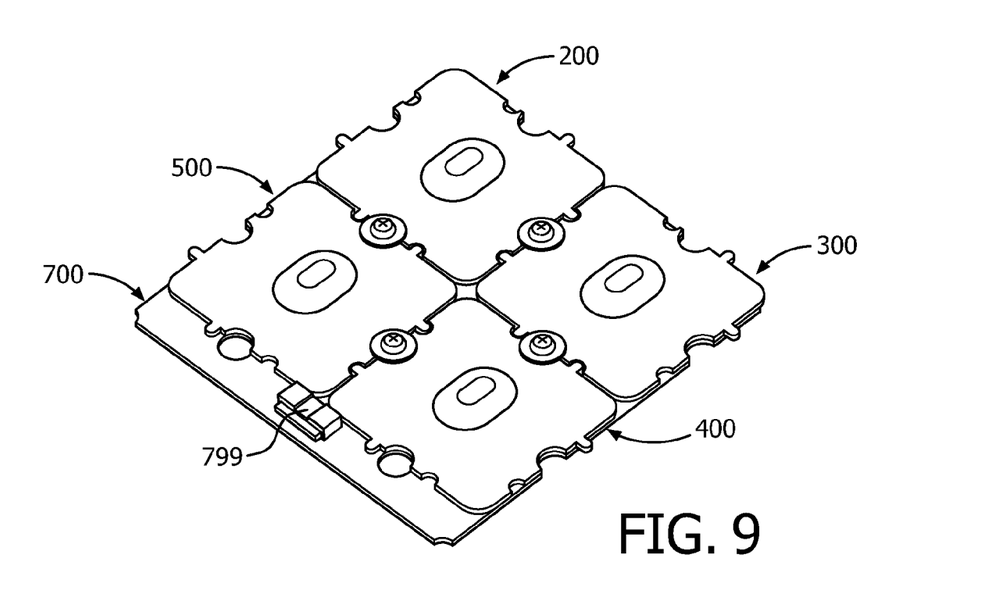
FIG. 9 shows a top perspective view of the lighting system of FIG. 8, after assembly.

FIGS. 8 and 9 show an alternative configuration of lighting system according to the invention, in which only one lens is born per optical module.

Figure 10:
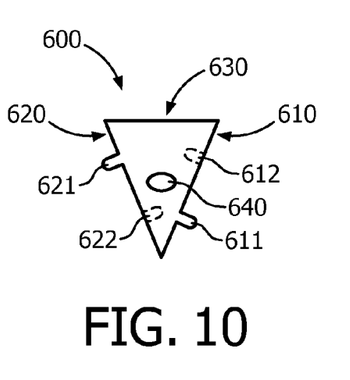
FIG. 10 shows a top view of a triangular-shape optical module.
Figure 11:
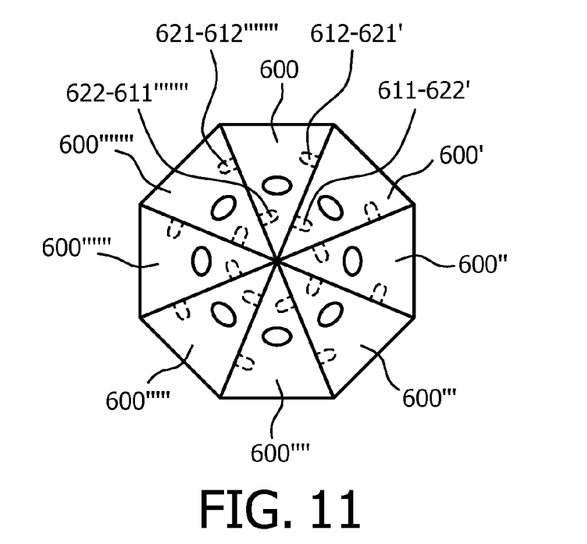
FIG. 11 shows a top view of an assembly of several triangular-shape optical modules of FIG. 10.

FIGS. 10 and 11 show an example of triangular-shaped optical modules 600, 600', 600", 600"', 600"", 600""', 600"""', 600"""'', a first side 610 of each optical module 600 being provided with first fool-proofing elements 611 (protrusion) and 612 (hole or slot) and a second side 620 of each optical module 600 being provided with second fool-proofing elements 621 (protrusion) and 622 (hole or slot). The first fool-proofing elements 611, 612 are adapted to respectively cooperate with the second fool-proofing elements 621, 622 (if the two sides 610 and 620 would be face to face).

The fool-proofing configuration of FIG. 10 can lead to the construction of FIG. 11, in which all the optical modules 600, 600', 600", 600"', 600"", 600""', 600"""', 600"""'' are positioned side-by-side around a common apex, without risk of wrong positioning thanks to the fool-proofing elements. This positioning of the optical modules might be defined from the optical configuration of the lenses 640. Optionally, fool-proofing elements might also be provided at the third side 630 of the optical module 600 so as to assembly, without error, another optical module from this third side 630.

Figure 12:
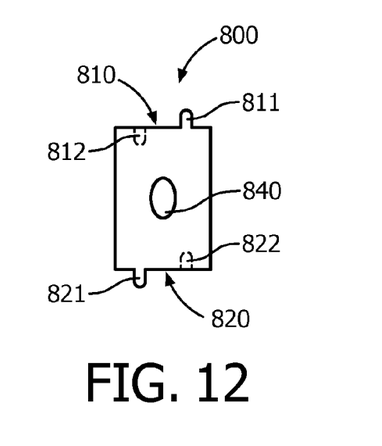
FIG. 12 shows a top view of a rectangular-shape optical module.
Figure 13:
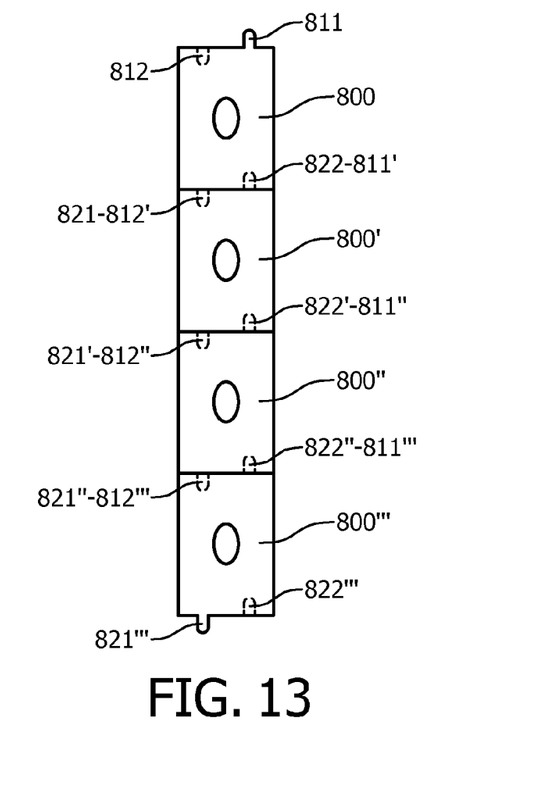
FIG. 13 shows a top view of a linear assembly of several rectangular-shape optical modules of FIG. 12.

FIGS. 12 and 13 show an example of rectangular-shaped optical modules 800, 800', 800", 800"', a first side 810 of each optical module 800 being provided with first fool-proofing elements 811 (protrusion) and 812 (hole or slot) and a second opposite side 820 of each optical module 800 being provided with second fool-proofing elements 821 (protrusion) and 822 (hole or slot). The first fool-proofing elements 811, 812 are adapted to respectively cooperate with the second fool-proofing elements 821, 822 (if the two opposite sides 810 and 820 would be face to face).

This fool-proofing concept might be useful in case the optical modules 800, 800', 800", 800"', are linearly positioned side-by-side (as depicted in FIG. 13) in the lighting system, to prevent from a wrong positioning of these optical modules.

The fool-proofing elements 811 and 812 are preferably asymmetrical, meaning that the centre point of these fool-proofing elements 811 and 812 (i.e. the center point between the fool-proofing elements) is offset from the centre point of the side 810. The same applied concerning the fool-proofing elements 821 and 822 with respect to the side 820.

Figure 14:
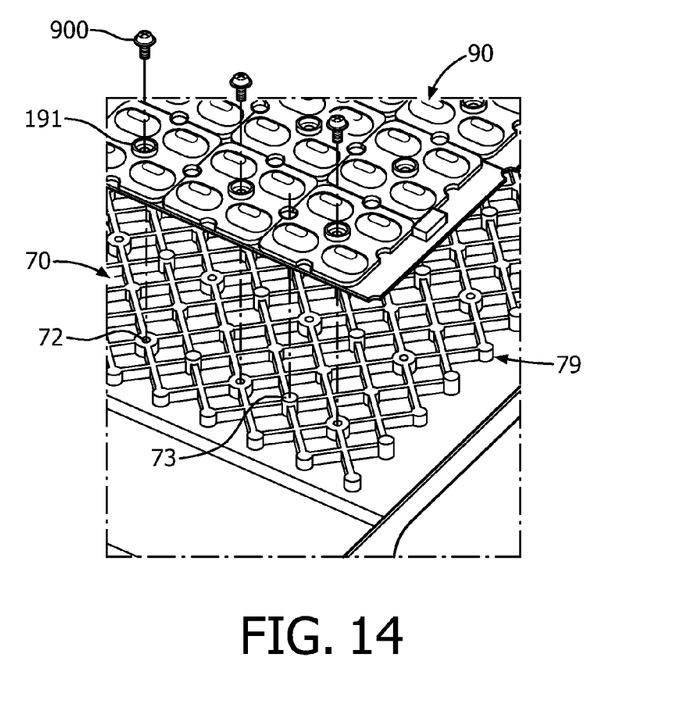
FIG. 14 is a perspective exploded bottom view of a lighting system according to the invention, with optical modules of FIG. 1.
Figure 15:
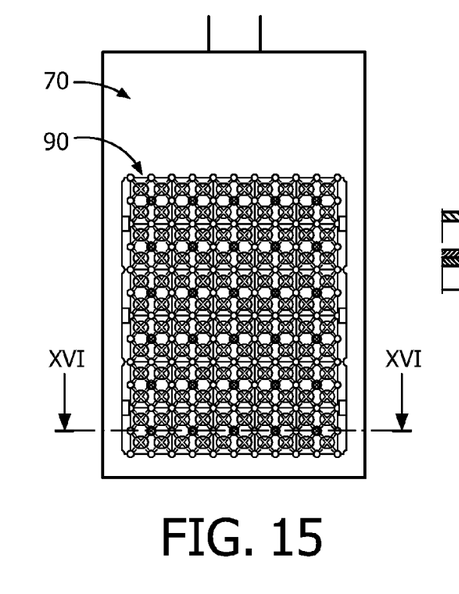
FIG. 15 is a bottom view of the lighting system of FIG. 14.
Figure 16:
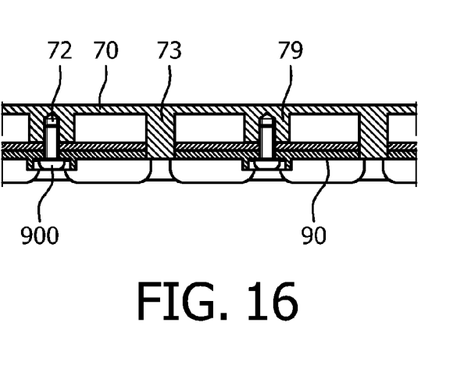
FIG. 16 is a cross-section view of the lighting system of FIG. 15 according to XVI-XVI plan.

FIGS. 14-16 show a first example of a lighting system according to the invention, comprising optical modules 100 of FIG. 1. It is obvious and clear that other types of optical modules can be used with this lighting system assembly. The lighting system comprises a lighting module 90 (made of the LED board and the optical board) fixed into a housing 70, via the through holes 191, by means of fixation means (e.g. screws or rivets). The inner surface of the housing 70 is design according to a pattern 79 to provide some holes 72 (e.g. threaded holes) sufficiently long to receive said fixation means 900.

Figure 17:
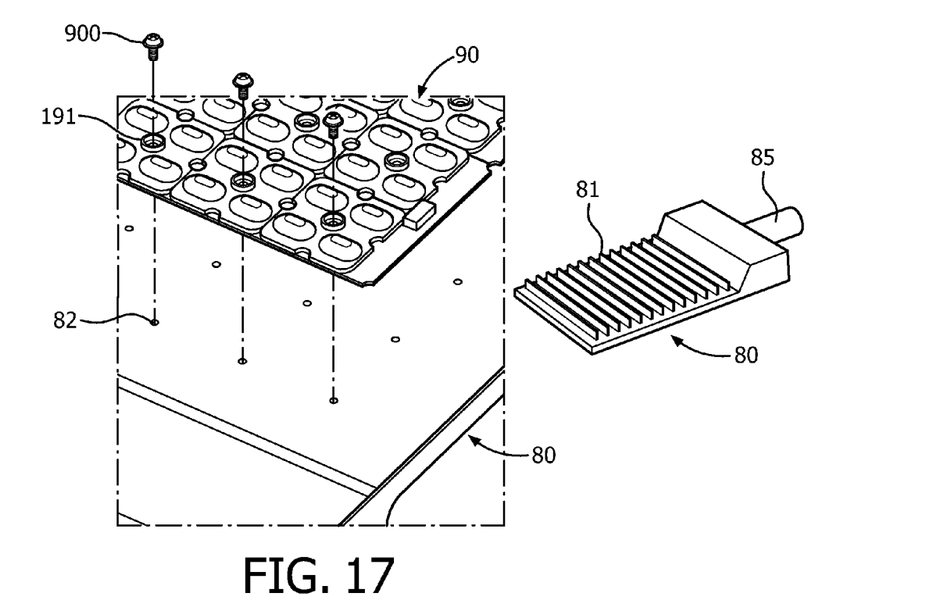
FIG. 17 is a perspective exploded bottom view of another lighting system according to the invention, with optical modules of FIG. 1.
Figure 18:
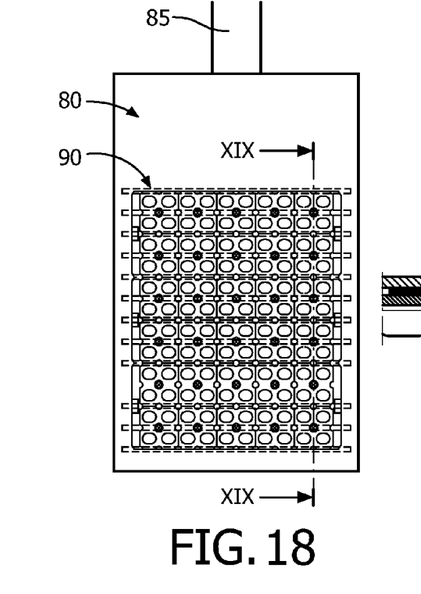
FIG. 18 is a bottom view of the lighting system of FIG. 17.
Figure 19:
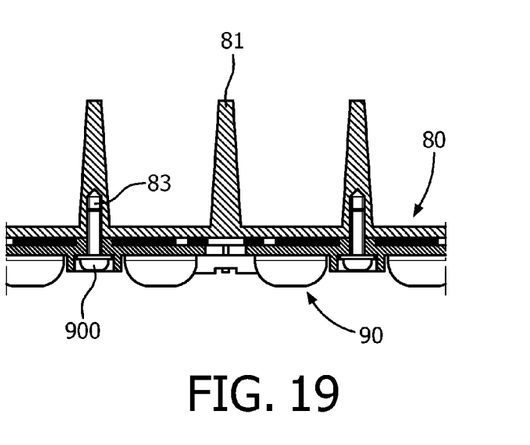
FIG. 19 is a cross-section view of the lighting system of FIG. 17 according to XIX-XIX plan.

FIGS. 17-19 show a second example of a lighting system comprising a housing 80, a mast 85 and fins 81 provided on the back side of the housing 80. Holes 83 (e.g. threaded holes) adapted to receive the fixation means 900 are provided, in this case, through the back side of the housing, within the fins—screws 900 are therefore protected from oxidization while keeping a housing relatively light and not cumbersome.

Figure 20:
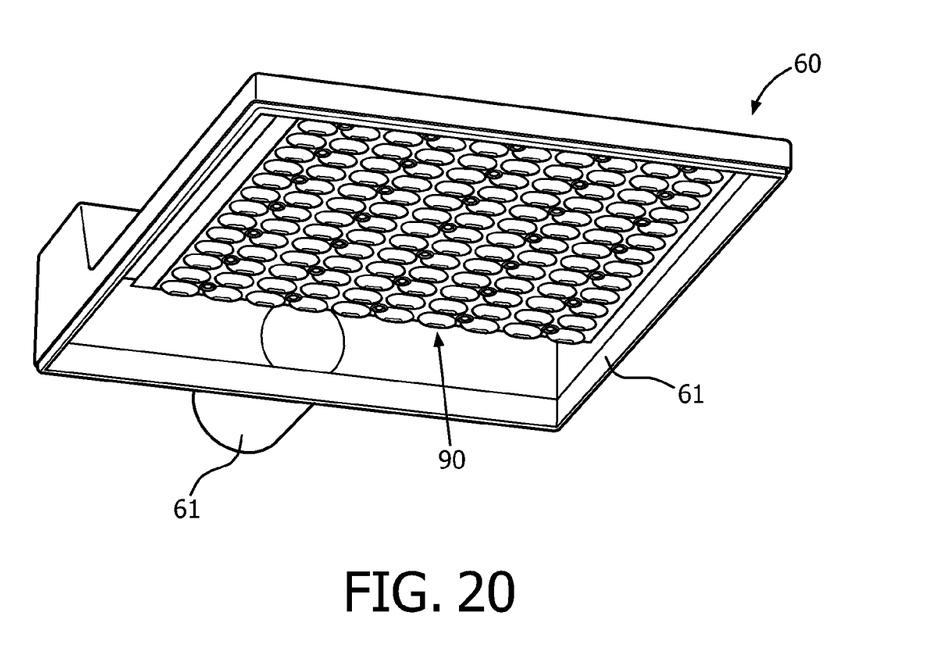
FIG. 20 is a perspective view of a complete lighting system according to the invention, with optical modules of FIG. 1.

FIG. 20 shows an example of a complete lighting system 60 according to the invention, comprising a mast post 61, lighting module 90 and a front glass 61 protecting the inner part of the housing 60.

While the invention has been illustrated and described in detail in the drawings and foregoing description, such illustration and description are to be considered illustrative or exemplary and not restrictive; the invention is not limited to the disclosed embodiments, and the person skilled in the art can clearly adapt the teaching of the invention, especially relating to the fool-proofing principle, to any other light configurations. In particular the lighting system does not necessarily comprise identical shapes of optical modules. Additionally, the examples herein described mention only the use of lenses as optical elements provided in the optical modules, but it is clear that the invention can be implemented with other types of optical elements (e.g. patterns made of phosphor materials, logos embedded in the optical modules, prisms, etc. or combinations thereof). It is also clear that the number of LEDs covered by these optical elements is not necessarily limited to one, but several LEDs (e.g. of RGB colors) might be covered by each optical elements.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality.

The invention claimed is:

1. A lighting system comprising:
   a LED board comprising a plurality of LEDs; and
   an optical board disposed on the LED board;
   wherein the optical board comprises a plurality of optical modules positioned side-by-side according to predetermined orientations one to the other, each optical module comprising at least one optical element adapted to face at least one of said LEDs and modify a feature of the light emitted by this at least one LED, wherein the optical modules further comprising a base part having sides provided with mechanical fool proofing elements adapted to prevent a positioning of the optical modules according to orientations one to the other different from said predetermined orientations and wherein the base part has at least a first, second, third and fourth side provided respectively with a first, second, third and fourth mechanical fool-proofing elements, wherein the first and the second mechanical fool-proofing elements are adapted to cooperate with each other, and the third and the fourth mechanical fool-proofing elements are adapted to cooperate with each other, and wherein the first and second fool-proofing elements cannot cooperate with either of the third and fourth fool-proofing elements.

2. The lighting system of claim 1, wherein the fool proofing elements are provided at least partly at the optical modules and are adapted to prevent a positioning side-by-side of the optical modules if they are not in said predetermined orientations.

3. The lighting system of claim 1, wherein at least a part of said optical elements is designed to exhibit asymmetrical optical distributions, and said predetermined orientations are defined so as to design a predetermined light effect taking into account these asymmetrical optical distributions.

4. The lighting system according to claim 3, wherein the LED board is made of LED modules positioned side-by-side, each LED module bearing at least one LED and being fixed to a corresponding optical module.

5. The lighting system according to claim 4, wherein at least a part of the optical modules have identical size and geometry.

6. The lighting system according to claim 5, further comprising a chassis to which the LED board and the optical board are fixed.

7. A lighting module to be positioned side-by-side with other lighting modules to form at least a part of the lighting system of claim 1, the lighting module comprising one optical module comprising at least one optical element adapted to face at least one LED and to modify feature of the light emitted by this at least one LED, wherein the optical module further comprises a base part provided with mechanical fool proofing elements adapted to allow only one side-by-side positioning of the optical module to another (identical) optical module and wherein the base part has at least a first, second, third and fourth side provided respectively with a first, second, third and fourth mechanical fool-proofing elements, wherein the first and the second mechanical fool-proofing elements are adapted to cooperate with each other, and the third and the fourth mechanical fool-proofing elements are adapted to cooperate with each other, and wherein the first and second fool-proofing elements cannot cooperate with either of the third and fourth fool-proofing elements.

8. The lighting module according to claim 7, wherein said mechanical fool-proofing elements provided on a side of the base comprise a protruding element protruding from the side and a slot provided into the side, and wherein the protruding element is not located at the center point of the side.

9. The lighting module according to claim 8, wherein the optical module comprises several optical elements:
    equidistant from; and
    having the same angle between them with respect to;
a point of the base part.

10. The lighting module according to claim 9, wherein the base part of the optical module has a square shape, and wherein said point of the base part is the center of the square.

11. The lighting module according to claim 10, wherein said at least one optical element is designed to exhibit asymmetrical optical distribution around a main axis obliquely oriented to the base part, and the base part comprising at least one mark indicating the orientation of this main axis with respect to the base part.

12. The lighting system according to claim 6, wherein the optical module comprises a through hole at its center.

13. The lighting system according to claim 6, wherein the optical module comprises through holes at each side of the optical module.

14. The lighting system according to claim 6, wherein the optical module comprises through holes at its center and at each side of the optical module.

* * * * *